(12) United States Patent
Shibano et al.

(10) Patent No.: US 7,745,071 B2
(45) Date of Patent: Jun. 29, 2010

(54) LARGE-SIZED GLASS SUBSTRATE

(75) Inventors: Yukio Shibano, Niigata-ken (JP);
Satoru Miharada, Niigata-ken (JP);
Shuhei Ueda, Niigata-ken (JP); Atsushi Watabe, Niigata-ken (JP); Masaki Tabata, Niigata-ken (JP)

(73) Assignee: Shin-Etsu Chemical Co., Ltd., Tokyo (JP)

( * ) Notice: Subject to any disclaimer, the term of this patent is extended or adjusted under 35 U.S.C. 154(b) by 509 days.

(21) Appl. No.: 11/674,049

(22) Filed: Feb. 12, 2007

(65) Prior Publication Data
US 2007/0132068 A1 Jun. 14, 2007

Related U.S. Application Data

(62) Division of application No. 10/355,154, filed on Jan. 31, 2003, now Pat. No. 7,191,618.

(30) Foreign Application Priority Data
Jan. 31, 2002 (JP) ............................. 2002-023416

(51) Int. Cl.
*G03F 1/00* (2006.01)
(52) U.S. Cl. .......................................... 430/5; 428/426
(58) Field of Classification Search ...................... 451/2, 451/5, 41; 427/164; 430/5; 428/426
See application file for complete search history.

(56) References Cited

U.S. PATENT DOCUMENTS

| 3,676,960 A | 7/1972 | Aspden |
| 4,836,840 A | 6/1989 | Hirota et al. |
| 4,915,720 A | 4/1990 | Hirota et al. |
| 5,157,878 A | 10/1992 | Hiyoshi et al. |
| 5,417,730 A | 5/1995 | Shigyo et al. |
| 5,484,325 A | 1/1996 | Shank |
| 5,776,219 A | 7/1998 | Jinbo et al. |
| 6,126,524 A | 10/2000 | Shepherd |
| 6,299,506 B2 | 10/2001 | Nishimura et al. |
| 6,638,140 B2 | 10/2003 | Kimura et al. |
| 6,855,908 B2 | 2/2005 | Takeuchi et al. |
| 6,928,837 B2 | 8/2005 | Takeuchi et al. |
| 7,183,210 B2 * | 2/2007 | Shibano et al. ............. 438/689 |
| 2003/0186624 A1 | 10/2003 | Koike et al. |
| 2005/0186691 A1 | 8/2005 | Koike et al. |

* cited by examiner

FOREIGN PATENT DOCUMENTS

| JP | 8-152319 A | 6/1996 |
| JP | 8-174395 A | 7/1996 |
| JP | 2000-55641 A | 2/2000 |
| JP | 2000-218481 A | 8/2000 |
| JP | 2000-292159 A | 10/2000 |

OTHER PUBLICATIONS

Abstract JP63-172158,Jul. 1988, 1 page.*
Machine Translation of JP 2000-016823, Jan. 2000, 6 pages.*

*Primary Examiner*—Carlos Lopez
(74) *Attorney, Agent, or Firm*—Birch, Stewart, Kolasch & Birch, LLP

(57) ABSTRACT

A large-sized substrate having a diagonal length of not less than 500 mm and a ratio of flatness/diagonal length of not more than $6\times10^{-6}$ is disclosed. By use of the large-sized substrate for exposure of the present invention, the exposure accuracy, particularly the register accuracy and resolution are enhanced, so that it is possible to achieve high-precision exposure of a large-sized panel. With the processing method according to the present invention, it is possible to stably obtain a large-sized photomask substrate with a high flatness, and since the CD accuracy (dimensional accuracy) at the time of exposure of the panel is enhanced, it is possible to perform exposure of a fine pattern, leading to a higher yield of the panel. Furthermore, by applying the processing method according to the present invention, it is also possible to create an arbitrary surface shape.

6 Claims, 3 Drawing Sheets

LARGE-SIZED GLASS SUBSTRATE

This application is a Divisional of application Ser. No. 10/355,154, now U.S. Pat. No. 7,191,618, filed on Jan. 31, 2003, the entire contents of which are hereby incorporated by reference and for which priority is claimed under 35 U.S.C. §120.

BACKGROUND OF THE INVENTION

The present invention relates to a large-sized substrate suitable for a synthetic quartz glass substrate for photomask, particularly a substrate for use in a TFT liquid crystal panel, and a method of producing the same.

Generally, for a TFT liquid crystal panel, an active method is adopted in which a liquid crystal is sealed between an array-side substrate with TFT devices incorporated therein and a substrate fitted with a color filter, and voltage is controlled by the TFT to thereby control the orientation of the liquid crystal.

At the time of producing the array side, a method is adopted in which images are printed on a mother glass such as non-alkali mother glass in a multiple layers by light exposure through originals carrying circuits drawn thereon, called large-sized photomasks. On the other hand, the color filter side is also produced by a method using lithography, called a dye impregnation method. The large-sized photomasks are required for production of both the array side and the color filter side, and, for carrying out light exposure with high accuracy, a synthetic quartz glass with a low coefficient of linear expansion is primarily used as the material of the large-sized photomasks.

Hitherto, enhancement of precision of the liquid crystal panel has been advanced from VGA through SVGA, XGA, SXGA, and UXGA, to QXGA, and it is said that a precision of 100 ppi (pixel per inch) class to 200 ppi class is necessary. Attendant on this, the requirement for the exposure accuracy on the TFT array side, particularly the register accuracy has come to be more and more rigorous.

In addition, production of the panel by the so-called low temperature polysilicon technology has also been conducted. In this case, it has been investigated to print a driver circuit and the like on an outer peripheral portion of a glass, separately from the pixels of the panel, and light exposure with a higher precision has come to be demanded.

On the other hand, as to the substrate for large-sized photomask, it is known that its shape influences the exposure accuracy. For example, where exposure is conducted by use of two large-sized photomask substrates differing in flatness, as shown in FIG. 1, the pattern would be staggered due to the difference in optical path. Namely, in FIGS. 1A and 1B, the broken lines show the optical paths in the case where the rays go straight and the mask has an ideal plain surface, but, actually, the rays are deviated as indicated by the solid lines. In addition, in the case of an exposure machine which uses an optical system having a focus, there is the phenomenon that the focus position is staggered from the exposure surface with the result of poor resolution. Therefore, a large-sized photomask substrate having a high flatness is desired, for achieving exposure with a higher accuracy.

Besides, for the purpose of obtaining a multiplicity of exposed patterns by a single exposure and enhancing the productivity of the panel, a large sized photomask substrate of, for example, 1500 mm in diagonal length has come to be demanded. Thus, a large size and a high flatness are demanded at the same time.

In general, a large-sized photomask substrate is produced by a method in which a plate form synthetic quartz is lapped by use of a slurry including free abrasive grains such as alumina suspended in water, to remove ruggedness of the surface of the plate form synthetic quartz, and thereafter the surface is polished by use of a slurry including an abrasive such as cerium dioxide suspended in water. The processing device used in this case is a double side processing machine, a single side processing machine or the like.

However, these processing methods have had the following drawback. In these methods, the repelling force against the elastic deformation generated when the substrate itself is pressed against the processing surface plate is utilized for correction of flatness. Therefore, when the substrate size is enlarged, the repelling force is lowered conspicuously, so that the capability of removing gradual ruggedness of the substrate surface is lowered. FIG. 2A shows the shape of the substrate 1 when the substrate 1 is held vertically, and FIG. 2B shows the shape of the substrate 1 during processing, illustrating that the substrate 1 is conforming in shape to the surface plate during processing. FIG. 2C illustrates the repelling force against the elastic deformation of the substrate 1 during processing; thus, the portion corresponding to the repelling force is processed more than the other portions are, by an amount ($\Delta P$) corresponding to the force.

Generally, a plain surface grinder adopts a method in which the work is passed through a fixed spacing between a work mount table and a processing tool, whereby the portions of the work in excess of the fixed spacing are removed by the processing tool. In this case, the work is pressed against the work mount table due to the grinding resistance of the processing tool; therefore, if the flatness of the back side of the work is not secured, the flatness of the face side of the work processed conforms to the flatness of the back side, so that the flatness cannot be improved.

Accordingly, in the case of a large-sized photomask substrate, it is very difficult to obtain a high flatness, although it is easy to suppress the dispersion of thickness of the substrate. Thus, the flatness of the substrate obtained by the prior art, in terms of the ratio of flatness/diagonal length, has been about $10 \times 10^{-6}$ at best, though depending on the substrate size.

Therefore, the flatness of the large-sized photomask substrate for TFT exposure currently available, say, in the case of a substrate 330×450 mm in size, is limited to 4 μm and the flatness/diagonal is limited to $7.3 \times 10^{-6}$; even for more larger substrates, a flatness/diagonal value lower than $7.3 \times 10^{-8}$ is absent under existing conditions.

In the conventional lapping processing, the repelling force against the elastic deformation of the substrate during processing is primarily utilized for correction of flatness, as has been mentioned above, so that a substrate with poor flatness tends to be improved in flatness in a comparatively short time. However, as the flatness is improved, the elastic deformation amount becomes smaller and, hence, the repelling force also becomes smaller, so that the flatness would not easily be further enhanced. In such a case, in practice, only the processing margin is increased, and it has been impossible to obtain a substrate with high flatness by the conventional lapping. This problem is present also in the case of plain surface grinding.

SUMMARY OF THE INVENTION

The present invention has been made in consideration of the above-mentioned circumstances of the prior art. Accordingly, it is an object of the present invention to provide a large-sized substrate, such as a large-sized photomask substrate, having a high flatness which has not been attained in the prior art, and a method of producing the same.

The present inventors, as a result of their earnest investigations for attaining the above object, have found out that a large-sized substrate, such as a large-sized photomask substrate, having a high parallelness and a high flatness can be stably obtained by partially processing and removing only projected portions of a substrate, and have completed the present invention based on the finding.

In accordance with one aspect of the present invention, there is provided a large-sized substrate having a diagonal length of not less than 500 mm and a ratio of flatness/diagonal length of not more than $6.0 \times 10^{-6}$.

Preferably, the large-sized substrate is a synthetic quartz glass substrate. In addition, the large-sized substrate may be a substrate for a large-sized photomask, and may be an array-side substrate of a TFT liquid crystal panel.

In accordance with another aspect of the present invention, there is provided a method of producing a large-sized substrate, including the steps of preliminarily measuring the flatness of a large-sized substrate having a diagonal length of not less than 500 mm, and partially removing projected portions of the substrate by a processing tool based on the measurement data so as thereby to enhance the flatness of the large-sized substrate.

In accordance with further aspect of the present invention, there is provided a method of producing a large-sized substrate, including the steps of preliminarily measuring the flatness and the parallelness of a large-sized substrate having a diagonal length of not less than 500 mm, and partially removing projected portions of the substrate by a processing tool based on the measurement data so as thereby to enhance the flatness and the parallelness of the large-sized substrate.

In the method, the large-sized substrate is preferably a synthetic quartz glass substrate. In the methods, the partial removal may be carried out by at least one method selected from the group consisting of grinding, lapping and polishing. The at least one method selected from the group consisting of grinding, lapping and polishing is preferably conducted under a fixed pressure. In the methods, the partial removal may be carried out by sandblasting. In the methods, preferably, an arbitrary portion of the surface of the substrate is removed by moving the substrate and/or the processing tool.

By using the large-sized substrate according to the present invention for light exposure, the exposure accuracy, particularly, the register accuracy and resolution are enhanced, so that it is possible to achieve high-precision exposure for a large-sized panel. In addition, by the processing method according to the present invention, it is possible to stably obtain a large-sized photomask substrate with a high flatness. Since the CD accuracy (dimensional accuracy) at the time of exposure of the panel is enhanced, it is possible to perform exposure of a fine pattern, leading to a higher yield of the panel. Furthermore, by the production method according to the present invention, the step of putting the parallelness into order and the step of putting the flatness into order can be combined into one step, so that the total time required for production is shortened, whereby a large-sized substrate with high accuracy can be obtained economically. Besides, by applying the processing method according to the present invention, it is also possible to create an arbitrary surface shape.

BRIEF DESCRIPTION OF THE DRAWINGS

FIG. 1 illustrates the optical path in the case of exposure of a substrate for a photomask, in which

FIG. 2 illustrates the mode of polishing a substrate on a processing surface plate, in which

DETAILED DESCRIPTION OF THE PREFERRED EMBODIMENTS

Figure 1A:
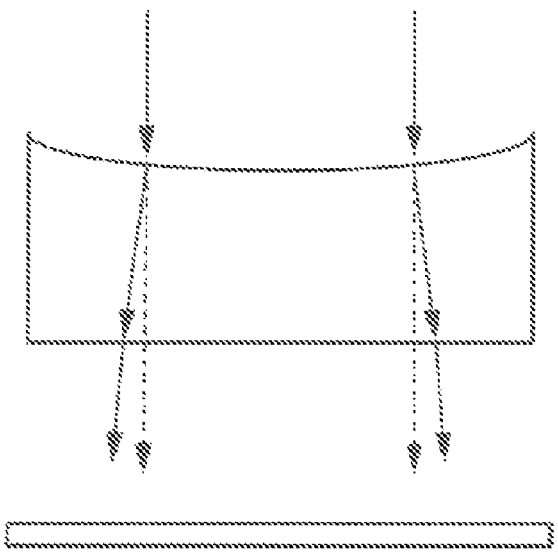
FIG. 1A shows the optical path in the case of a substrate concave on the upper side.
Figure 1B:
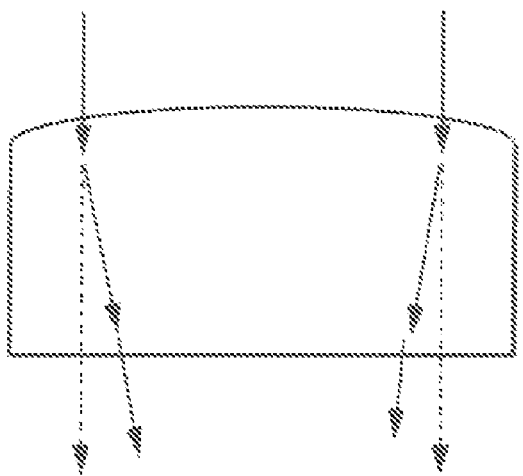
FIG. 1B shows the optical path in the case of a substrate convex on the upper side.
Figure 2A:
FIG. 2A is a front view showing the shape of the substrate when the substrate is held vertically.
Figure 2B:
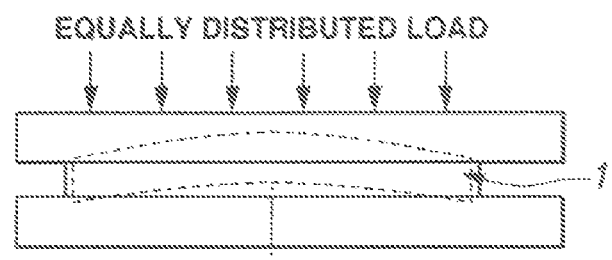
FIG. 2B is a front view showing the condition where the substrate conforms in shape to the surface plate during processing.
Figure 2C:
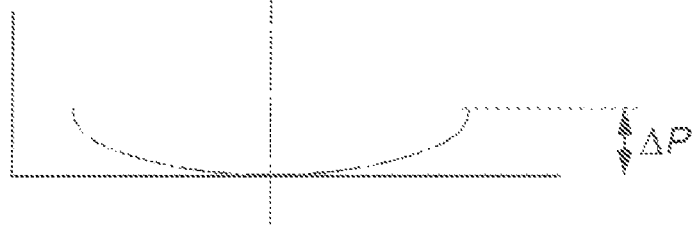
FIG. 2C illustrates the repelling force on the lower surface plate during processing.

Now, the present invention will be described in detail below.

The large-sized substrate according to the present invention is particularly preferably a synthetic quartz glass substrate, which is used as a photomask substrate, an array-side substrate of a TFT liquid crystal panel, or the like, and has a diagonal length of not less than 500 mm, preferably 500 to 2000 mm. The large-sized substrate may be square, rectangular, circular or the like in shape; where the substrate is circular, the diagonal length means the diameter of the circle. The thickness of the large-sized substrate is not limited, and preferably is 1 to 20 mm, particularly 5 to 12 mm.

The large-sized substrate according to the present invention has a high flatness such as to have a flatness/diagonal of not more than $6.0 \times 10^{-6}$, and particularly preferably has a flatness/diagonal of not more than $4.0 \times 10^{-6}$. The lower limit of the flatness/diagonal is not particularly restricted, and generally is $2.0 \times 10^{-6}$.

It is preferable that the parallelness of the large-sized substrate according to the present invention is not more than 50 µm, particularly not more than 10 µm. The flatness and the parallelness are measured by a flatness tester (produced by Kuroda Seiko Co., Ltd.).

In order to obtain such a large-sized substrate, first, the flatness of a plate material for the large-sized substrate is measured. It is preferable that the plate material as a raw material is first processed by a double side lapping device to secure parallelness of the plate (dispersion of thickness in the substrate). This is because it is necessary to preliminarily put the parallelness into order in view of that where the parallelness of the substrate is poor, thicker portions are removed more by the subsequent double side processing, whereby the flatness is worsened by the double side processing. Therefore, where the parallelness of the substrate is poor, it is preferable to preliminarily measure the flatness and the parallelness (dispersion of thickness of the substrate); by this, the lapping step for putting the thickness of the substrate into order and the step of correcting the flatness can be combined into one step, and, therefore, this is easy and economical. The flatness is measured by holding the substrate vertically, for obviating the deformation of the plate material due to its own weight.

Next, the measurement data are stored in a computer, as height data at each point in the substrate. Based on the data, the processing tool is brought to the projected portion, and processing is conduced by controlling the dwell time of the processing tool so that the height at each point in the substrate is adjusted to the height of the most recessed point in the substrate. For example, where the processing tool is sandblast, the dwell time is so controlled that the dwell time is set to be longer by lowering the moving speed of the sandblast nozzle at a projected portion and the dwell time is set to be shorter by raising the moving speed of the sandblast nozzle at a recessed portion, based on the measurement data, whereby the desired processing can be performed.

Where the parallelness of the substrate is poor, the computation is individually performed for the face side and the back side of the substrate, then the parallelness after processing is computed from the above-mentioned dwell time, and the dwell time of the processing tool is computed from the computed data so that the thickness at each point is adjusted to the thickness of the thinnest portion of the substrate. The final dwell time for the processing tool is obtained from the three kinds of computation data. Then, for example, where the processing tool is sandblast, the dwell time is controlled by decreasing or increasing the moving speed of the sandblast nozzle, whereby the desired processing can be performed.

In addition, the processing can also be performed by fixing the nozzle moving speed and the air pressure and controlling the distance between the substrate and the sandblast nozzle. This is based on utilization of the processing characteristics such that the processing speed is high where the distance between the sandblast nozzle and the substrate surface is small, and the processing speed is low where the distance is large.

Furthermore, the object can also be attained by fixing the nozzle moving speed and conducting such a pressure control that the pressure of air blown from the sandblast nozzle is higher at projected portions of the substrate, and is lower at recessed portions of the substrate.

In the case of individually flattening the face side and the side and the back side of the plate material as a raw material are measured, and the height data are stored in a computer. Then, projected portions of the face side are processed and removed so that the height at each point in the face side is adjusted to the height of the most recessed point in the face side, to thereby achieve flattening of the face side; and projected portions of the back side are processed and removed so that the height at each point in the back side is adjusted to the height of the most recessed portion in the back side, to thereby achieve flattening of the back side.

Figure 3:
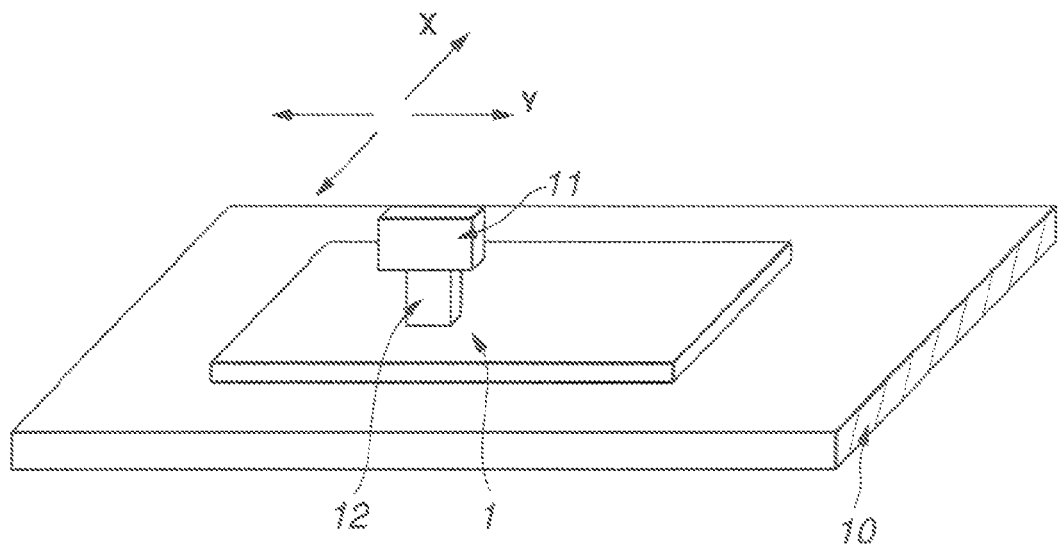
FIG. 3 is a perspective view showing an outline of a processing device.

For example, where the processing tool is a sandblast nozzle, the method of processing for correction of parallelness and correction of flatness can be carried out by use of a device shown in FIG. 3. Here, numeral 10 in the figure denotes a substrate holding base, 11 denotes a sandblast nozzle, and 12 denotes an airflow containing abrasive grains. Numeral 1 denotes the substrate.

The processing tool has such a structure as to be arbitrarily movable in X and Y directions, and the movement can be controlled by a computer. In addition, the processing can also be performed by an X-θ mechanism. The air pressure has relations with the abrasive grains used and the distance between the processing tool and the substrate, cannot be determined univocally, and can be regulated in view of removal speed and processing strain depth.

In addition, in this production method, only the projected portions and thick portions of the substrate are selectively removed, so that a substrate poor in flatness can be securely improved, and it is possible not only to obtain a high-flatness substrate by precision control of the processing tool but also to speedily realize an improvement in the flatness of the substrate by a rough control of the processing tool.

The abrasive grains to be used are not particularly restricted, and are preferably those of #600 to #3000. Where the grain diameter of the abrasive grains is greater than #600, the strain due to processing is large, so that the processing margin for the subsequent step for removing the strain is large, and it is necessary to use a large original plate thickness, and a large amount of blank material is needed, which may be disadvantageous on an economic basis. On the other hand, where the grain diameter is smaller than #3000, the removal speed is low, so that the sandblasting may take long time.

On the other hand, where a method selected from grinding, lapping and polishing is used as the processing tool in the flattening method, the processing tool has such a structure as to be rotatable by a motor, and the pressure load on the processing tool can be exerted by air or the like.

The processing tool may be either of the plane contact type and the line or point contact type. From the viewpoint of control of the processing speed, the plane contact type is preferred. In the case of the processing tool of the plane contact type, the area of contact with the work (large-sized substrate) is not more than 60 cm$^2$ at maximum, and is preferably not more than 40 cm$^2$. If the contact area exceeds 60 cm$^2$, it is impossible to finely control the removal amount at each point in the substrate, so that it may be difficult to obtain a substrate with high flatness.

Furthermore, the removal speed in processing varies depending on the material, size, the pressure load and the shape of the processing tool. Therefore, it is necessary to preliminarily grasp the processing characteristics of the processing tool to be used, and the reflect the processing characteristics on the dwell time of the processing tool.

The material of the processing tool is not particularly limited, as long as the tool can process and remove the work; for example, the material may be GC grindstone, WA grindstone, diamond grindstone, cerium grindstone, cerium pad, or the like. However, it is preferable, for example, to process by a processing tool for grinding or lapping, and thereafter to process by a processing tool for polishing.

The correction of accuracy (flatness) by the processing tool must be conducted for both sides of the substrate in the case where a double side lapping device or a double side polishing device is used in a step immediately after the correction of accuracy. Where both sides are not treated, the ruggedness of the untreated side worsens the accuracy of the flattened surfaces upon the double side lapping or polishing in the subsequent step. For example, the processing pressure is raised and the polishing speed is enhanced, on the back side of projected portions of the untreated surface. On the contrary, the processing pressure is lowered and the polishing speed is lowered, on the back side of recessed portions. As a result, the treated surface which has been flattened by the flattening treatment and corrected in accuracy would rather be worsened in flatness by the subsequent double side lapping or polishing.

Incidentally, where the subsequent step is single side processing, correction of accuracy can be achieved also by applying the single side processing to the uncorrected surface, with the surface corrected by the processing tool as a reference surface. In addition, it is also possible to obtain the substrate according to the present invention, by finally polishing for finishing the substrate surface, as required.

EXAMPLE

Now, the present invention will be described concretely while giving Examples and Comparative Examples below, but the present invention is not limited to the following Examples.

Example 1

A synthetic quartz substrate 330×450 mm (diagonal length: 558 mm) in size and 5.3 mm in thickness was processed on a double side lapping device performing a planetary motion by use of GC#600 produced by Fujimi Kenmazai Kogyo, Co. Ltd. to prepare a raw substrate. The accuracy of the raw substrate at this time was a parallelness of 3 μm and a flatness of 22 μm (flatness/diagonal: $3.9\times10^{-6}$), and the shape of the raw material was such that a central portion was higher.

The parallelness and the flatness were measured by use of a flatness tester (FTT-1500) produced by Kuroda Seiko Co., Ltd.

Then, the plate was mounted on a substrate holding base of the device shown in FIG. 3. In this case, the device used had a structure in which a processing tool is fitted to and rotatable by a motor and a pressure can be applied to the processing tool by air. In addition, the processing tool can be moved substantially in parallel relative to the substrate holding base, in X-axis and Y-axis directions.

As the processing tool, an annular resin-bonded diamond grindstone #800 having an area of 30.6 cm² (outside diameter: 80 mmφ, inside diameter: 50 mmφ) was used.

Next, the processing tool was moved at a revolution number of 2000 rpm and a processing pressure of 3 kPa, to process the entire surface of the substrate. At this time, Kurecut produced by Kure-Norton diluted with a 100-fold amount of water was used as a coolant.

Figure 4:
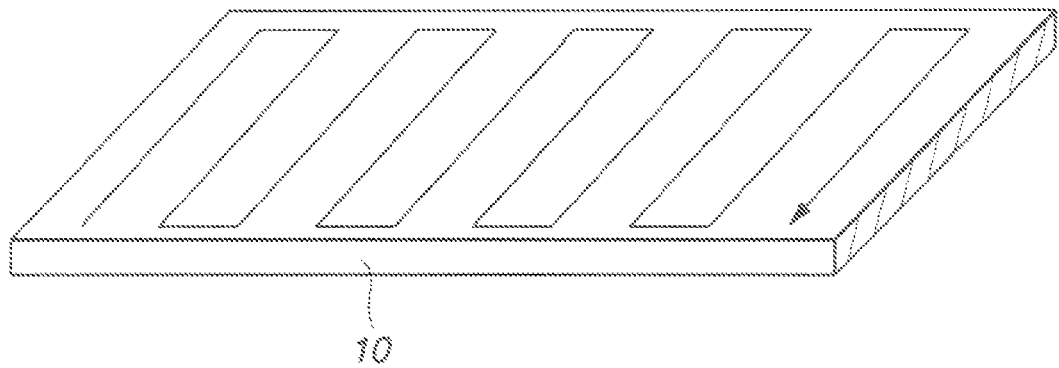
FIG. 4 is a perspective view showing a mode of movement of a processing tool.

The processing was conducted by a method in which the processing tool is continuously moved in parallel with the X-axis and moved at a pitch of 20 mm in the Y-axis direction, as indicated by the arrow in FIG. 4. Under these conditions, the processing speed was preliminarily measured to be 20 μm/min.

The moving speed of the processing tool was 30 mm/sec at an outer peripheral portion of the substrate which is the lowest portion of the substrate shape. The moving speed at each portion of the substrate was calculated from the required dwell time of the processing tool determined for each portion of the substrate, and the processing tool was moved accordingly, whereby both sides of the substrate were treated. The processing time was 100 min.

Thereafter, the substrate was subjected to 50 μm polish by a double side polishing device, and then the flatness was measured to be 3.2 μm (flatness/diagonal: $5.7\times10^{-6}$). At this time, the flatness was measured by use of the flatness tester produced by Kuroda Seiko Co., Ltd.

Example 2

Before the same synthetic quartz substrate as that in Example 1 was subjected to 50 μm polish on a double side polishing machine, the substrate was processed by a tool obtained by adhering a cerium pad to a processing tool having an outside diameter of 80 mm and an inside diameter of 50 mm, while pouring a slurry including cerium oxide suspended in water at a concentration of 10 wt % by weight. The processing speed under these conditions was 2 μm/min. The tool movement conditions were determined in the same manner as the moving conditions for the diamond grindstone tool. The processing time was 120 min (total: 220 min). Thereafter, the substrate was subjected to 50 μm polished, and then the flatness was measured to be 1.9 μm (flatness/diagonal: $3.4\times10^{-6}$).

Example 3

The process of Example 1 was repeated, except that the processing tool for grinding was not used and only a cerium pad was used as the processing tool.

Example 4

The process of Example 1 was repeated, except that a lap surface plate made of FCD450 and having 1 mm grooves at a 5 mm pitch was used as the processing tool, together with FO#1000 as a lapping compound.

Example 5

The process of Example 1 was repeated, except that GC#320 grindstone was used as the processing tool.

Example 6

The process of Example 1 was repeated, except that WA#1000 grindstone was used as the processing tool.

Example 7

The process of Example 1 was repeated, except that the substrate was 520×800 mm (diagonal length: 954 mm) in size and 10.3 mm in thickness.

Example 8

The process of Example 2 was repeated, except that the substrate size was 520×800×10.3 mm, the same as in Example 7.

Example 9

The process of Example 1 was repeated, except that the processing tool shape was 3.9 cm² (outside diameter: 30 mmφ, inside diameter: 20 mmφ).

Example 10

The process of Example 1 was repeated, except that the processing tool shape was 50 mm² (outside diameter: 100 mmφ, inside diameter: 60 mmφ).

Example 11

The same synthetic quartz substrate as that in Example 1 was mounted on a substrate holding base in the same manner as in Example 1, and a sandblast nozzle has such a structure as to be movable substantially in parallel to the substrate holding base in X-axis and Y-axis directions. Abrasive grains FO#800 produced by Fujimi Kenmazai Kogyo. Co. Ltd. were used, and the air pressure was set at 0.1 MPa.

The sandblast nozzle was 1 mm×40 mm rectangular in shape, and the spacing between the sandblast nozzle and the substrate surface was 40 mm.

The processing was conducted by a method in which the sandblast nozzle was continuously moved in parallel with the X-axis and moved at a 20 mm pitch in the Y-axis direction as shown in FIG. 4. The processing speed under these conditions had been preliminarily measured to be 300 μm/min.

The moving speed of the sandblast nozzle was 50 mm/sec at an outer peripheral portion of the substrate which was the lowest portion of the substrate shape. The moving speed at each portion of the substrate was calculated from the required dwell time of the sandblast nozzle determined for each portion of the substrate, and the processing position was moved by moving the stage, whereby both sides of the substrate were treated.

Thereafter, the substrate was subjected to 50 μm polish on a double side polishing device, and the flatness was measured to be 3.2 μm (flatness/diagonal: $5.7 \times 10^{-6}$). The flatness was measured by a flatness tester produced by Kuroda Seiko Co., Ltd.

Example 12

The process of Example 11 was repeated, except that the abrasive grains were GC#800 produced by Fujimi Kenmazai Kogyo. Co. Ltd., and the air pressure was set at 0.08 MPa.

Example 13

The process of Example 11 was repeated, except that the abrasive grains were FO#600, and the air pressure was 0.05 MPa.

Example 14

The process of Example 11 was repeated, except that the abrasive grains were GC#3000, and the air pressure was 0.15 MPa.

Example 15

The process of Example 11 was repeated, except that the abrasive grains were FO#3000, and the air pressure was 0.15 MPa.

Example 16

The process of Example 11 was repeated, except that the substrate was 520×800 mm (diagonal length: 954 mm) in size and 10.4 mm in thickness.

Example 17

A structure in which the spacing between the sandblast nozzle and the substrate surface can be arbitrarily controlled was used, and the moving speeds of X and Y stages were 10 mm/sec.

The substrate surface shape was preliminarily stored in a computer in the same manner as in Example 11, and a control of spacing the nozzle and the substrate closely at projected portions of the substrate and spacing them away from each other at recessed portions of the substrate was performed. The spacing between the sandblast nozzle and the substrate surface was varied in the range of 30 to 100 mm. The abrasive grains used were FO#800.

Example 18

A synthetic quartz substrate 330×450 mm (diagonal length: 558 mm) in size and 5.4 mm in thickness was prepared. The accuracy of the raw substrate was a parallelness of 70 μm and a flatness of 40 μm.

The parallelness and the flatness were measured by a flatness tester (FTT-1500) produced by Kuroda Seiko Co., Ltd.

The plate was mounted on a substrate holding base of a device shown in FIG. 3. In this case, the device has a structure in which the processing tool is fitted to and rotatable by a motor, and air pressure can be applied to the processing tool. The processing tool has such a structure as to be movable substantially in parallel with the substrate holding base in X-axis and Y-axis directions.

An annular resin-bonded diamond grindstone #800 having an area of 30.6 cm² (outside diameter: 80 mmφ, inside diameter: 50 mmφ) was used as the processing tool.

Next, the processing tool was moved on the work at a revolution number of 2000 rpm and a processing pressure of 3 kPa. At this time, Kurecut produced by Kure-Norton diluted with a 100-fold amount of water was used as a coolant.

The processing was conducted by a method in which the processing tool was continuously moved in parallel to the X-axis and moved at a 20 mm pitch in the Y-axis direction, as indicated by the arrow in FIG. 4. The processing speed under these conditions had been preliminarily measured to be 20 μm/min.

The moving speed of the processing tool was 30 mm/sec at an outer peripheral portion of the substrate which is the lowest portion of the substrate shape. The moving speed at each portion of the substrate was calculated from the required dwell time determined for each portion of the substrate, and the processing tool was moved accordingly, whereby both sides of the substrate were treated. Then, the flatness and the parallelness were measured. At this time, the processing time was 80% of the total time in the case where correction of flatness was conducted after correction of parallelness by double side lapping.

Example 19

The process of Example 18 was repeated, except that a lap surface plate made of FCD450 and provided with 1 mm grooves at a 5 mm pitch was used as the processing tool, together with FO#1000 as the lapping compound.

Example 20

The process of Example 18 was repeated, except that the substrate was 520×800 mm (diagonal length: 954 mm) in size and 10.3 mm in thickness.

Example 21

The same synthetic quartz substrate as that in Example 18 was mounted on a substrate holding base in the same manner as in Example 18. The sandblast nozzle has such a structure as to be movable substantially in parallel with the substrate holding base in X-axis and Y-axis directions. Abrasive grains FO#800 produced by Fujimi Kenmazai Kogyo. Co. Ltd. were used, and the air pressure was set at 0.1 MPa.

The sandblast nozzle used was 1 mm×400 mm rectangular in shape, and the spacing between the sandblast and the substrate surface was set to be 40 mm.

Processing was conducted by a method in which the sandblast nozzle was continuously moved in parallel to the X-axis and moved at a 20 mm pitch in the Y-axis direction, as shown in FIG. 4. The processing speed under these conditions had been preliminarily measured to be 300 μm/min.

The moving speed of the sandblast nozzle was 50 mm/sec at the fastest portion (the most recessed portion) of the substrate shape. The moving speed at each portion of the substrate was calculated from the required dwell time of the sandblast nozzle determined for each portion of the substrate, and the processing device was moved by moving the stages, whereby both sides of the substrate were treated.

Example 22

The process of Example 21 was repeated, except that abrasive grains GC#800 produced by Fujimi Kenmazai Kogyo. Co. Ltd. were used, and the air pressure was set at 0.08 MPa.

Example 23

The process of Example 21 was repeated, except that abrasive grains GC#3000 were used, and the air pressure was set to be 0.15 MPa.

Example 24

The process of Example 21 was repeated, except that the substrate was 520×800 mm (diagonal length: 954 mm) in size and 10.4 mm in thickness.

Example 25

The process of Example 21 was repeated, except that the substrate was 700×1100 mm (diagonal length: 1304 mm) in size and 10.4 mm in thickness.

Comparative Example 1

The same synthetic substrate as that in Example 1 was processed on a double side lapping device and a double side polishing device, without conducting correction of accuracy by partial processing. In the lapping, a slurry including FO#1000 produced by Fujimi Kenmazai Kogyo. Co. Ltd. suspended in water at a concentration of 10 wt % was used as a lapping slurry. In the polishing, a slurry including cerium oxide suspended in water at a concentration of 10 wt % was used as a polishing slurry.

Comparative Example 2

The process of Comparative Example 1 was repeated, except that synthetic quartz substrate 520×800 mm (diagonal length: 954 mm) in size and 10.3 mm in thickness was used.

Comparative Example 3

The process of Comparative Example 1 was repeated, except that the processing tool had an area of 63 cm² (outside diameter: 120 mmφ, inside diameter: 80 mmφ).

The results of the above Examples (Ex.) and Comparative Example (Com. Ex.) are summarized in Table 1 to 4 below.

TABLE 1

| Example | Substrate size (mm) | Accuracy before flatness processing (flatness/diagonal) | Processing tool | Tool area (cm$^2$) | Processing speed (μm/min) | Accuracy after processing (flatness/diagonal) |
|---|---|---|---|---|---|---|
| 1 | 330 × 450 × 5.3 | $39 \times 10^{-6}$ | Resin-bonded diamond Grindstone #800 | 30.6 | 20 | $5.7 \times 10^{-6}$ |
| 2 | 330 × 450 × 5.3 | $43 \times 10^{-6}$ | Resin-bonded diamond Grindstone #800 + Cerium pad | 30.6 30.6 | 20 2 | $3.4 \times 10^{-6}$ |
| 3 | 330 × 450 × 5.3 | $36 \times 10^{-6}$ | Cerium pad | 30.6 | 2 | $4.3 \times 10^{-6}$ |
| 4 | 330 × 450 × 5.3 | $34 \times 10^{-6}$ | FCD450 lap surface | 30.6 | 2 | $4.9 \times 10^{-6}$ |
| 5 | 330 × 450 × 5.3 | $39 \times 10^{-6}$ | GC#320 Grindstone | 30.6 | 30 | $5.4 \times 10^{-6}$ |
| 6 | 330 × 450 × 5.3 | $36 \times 10^{-6}$ | WA#1000 Grindstone | 30.6 | 10 | $5.0 \times 10^{-6}$ |
| 7 | 520 × 800 × 10.3 | $36 \times 10^{-6}$ | Resin-bonded diamond Grindstone #800 | 30.6 | 20 | $4.9 \times 10^{-6}$ |
| 8 | 520 × 800 × 10.3 | $34 \times 10^{-6}$ | Resin-bonded diamond Grindstone #800 + Cerium pad | 30.6 30.6 | 20 2 | $3.2 \times 10^{-6}$ |
| 9 | 330 × 450 × 5.3 | $43 \times 10^{-6}$ | Resin-bonded diamond Grindstone #800 | 3.9 | 8 | $4.8 \times 10^{-6}$ |
| 10 | 330 × 450 × 5.3 | $36 \times 10^{-6}$ | Resin-bonded, diamond Grindstone #800 | 50 | 24 | $5.7 \times 10^{-6}$ |

TABLE 2

| Example | Substrate size (mm) | Accuracy before flatness processing (flatness/diagonal) | Sandblast nozzle-substrate surface distance (mm) | Air pressure (Mpa) | Abrasive grain | Accuracy after processing (flatness/diagonal) |
|---|---|---|---|---|---|---|
| 11 | 330 × 450 × 5.3 | $39 \times 10^{-6}$ | 40 | 0.1 | FO#800 | $5.7 \times 10^{-6}$ |
| 12 | 330 × 450 × 5.3 | $36 \times 10^{-6}$ | 40 | 0.08 | GC#800 | $5.2 \times 10^{-6}$ |
| 13 | 330 × 450 × 5.3 | $50 \times 10^{-6}$ | 40 | 0.05 | FO#600 | $5.6 \times 10^{-6}$ |
| 14 | 330 × 450 × 5.3 | $43 \times 10^{-6}$ | 40 | 0.15 | GC#3000 | $4.8 \times 10^{-6}$ |
| 15 | 330 × 450 × 5.3 | $47 \times 10^{-6}$ | 40 | 0.15 | FO#3000 | $5.2 \times 10^{-6}$ |
| 16 | 520 × 800 × 10.3 | $38 \times 10^{-6}$ | 40 | 0.1 | FO#800 | $5.3 \times 10^{-6}$ |
| 17 | 330 × 450 × 5.3 | $39 \times 10^{-6}$ | 30~100 | 0.1 | FO#800 | $5.0 \times 10^{-6}$ |

TABLE 3

| Example | Substrate size (mm) | Processing tool | Accuracy of raw material flatness (μm) | Accuracy of raw material paralleleness (μm) | Accuracy after processing flatness (μm) | Accuracy after processing paralleleness (μm) | Processing time ratio (%) |
| --- | --- | --- | --- | --- | --- | --- | --- |
| 18 | 330 × 450 × 5.4 | Resin-bonded diamond Grindstone #800 | 40 | 70 | 3.2 | 3.4 | 80 |
| 19 | 330 × 450 × 5.4 | FCD450 lap surface | 36 | 58 | 3.0 | 3.5 | 90 |
| 20 | 520 × 800 × 5.4 | Resin-bonded diamond Grindstone #800 | 43 | 77 | 5.2 | 4.3 | 70 |
| 21 | 330 × 450 × 5.4 | Sandblast FO#800 0.1 Mpa | 46 | 64 | 3.0 | 3.0 | 70 |
| 22 | 330 × 450 × 5.4 | Sandblast FO#800 0.08 Mpa | 30 | 53 | 3.3 | 2.6 | 75 |
| 23 | 330 × 450 × 5.4 | Sandblast FO#600 0.05 Mpa | 35 | 55 | 2.8 | 3.1 | 80 |
| 24 | 520 × 800 × 10.4 | Sandblast FO#800 0.1 Mpa | 51 | 72 | 3.8 | 3.7 | 65 |
| 25 | 700 × 1100 × 10.4 | Sandblast FO#800 0.1 Mpa | 66 | 120 | 6.2 | 5.9 | 60 |

TABLE 4

| Comparative Example | Substrate size (mm) | Accuracy before flatness processing (flatness/diagonal) | Processing tool | Tool area (cm$^2$) | Processing speed (μm/min) | Accuracy after processing (flatness/diagonal) |
| --- | --- | --- | --- | --- | --- | --- |
| 1 | 330 × 450 × 5.3 | 36 × 10$^{-6}$ | | 30.6 | 8 | 22 × 10$^{-6}$ |
| 2 | 520 × 800 × 10.3 | 39 × 10$^{-6}$ | | 30.6 | 8 | 25 × 10$^{-6}$ |
| 3 | 330 × 450 × 5.3 | 32 × 10$^{-6}$ | Resin-bonded diamond Grindstone #800 | 63 | 30 | 8.2 × 10$^{-6}$ |

The invention claimed is:

1. A large-sized substrate comprising a synthetic quartz glass substrate for a large-sized photomask, having a diagonal length of not less than 500 mm, a ratio of flatness/diagonal length of not more than 6.0×10$^{-6}$, and a thickness of 5 to 20 mm.

2. A large-sized substrate as set forth in claim 1, wherein said large-sized substrate is an array-side substrate of a TFT liquid crystal panel.

3. The large-sized substrate of claim 1, wherein a parallelness of the substrate is not more than 50 μm.

4. The large-sized substrate of claim 1, wherein a shape of the substrate is rectangular, and the substrate size is 330 mm×450 mm×5.3 mm to 700 mm×1100 mm×10.4 mm.

5. The large-sized substrate of claim 1, wherein a shape of the substrate is rectangular, and the substrate size of 330 mm×450 mm×5.3 mm and a parallelness of the substrate is not more than 10 μm.

6. The large-sized substrate of claim 1, wherein a shape of the substrate is rectangular, and the substrate size of 520 mm×800 mm×10.3 mm to 700 mm×1100 mm×10.4 mm and a parallelness of the substrate is not more than 50 μm.

* * * * *